United States Patent [19]

Srinivasan et al.

[11] Patent Number: 6,029,082

[45] Date of Patent: Feb. 22, 2000

[54] LESS-CLAUSTROPHOBIC, QUADRATURE, RADIO-FREQUENCY HEAD COIL FOR NUCLEAR MAGNETIC RESONANCE

[75] Inventors: Ravi Srinivasan, Richmond Heights, Ohio; Haiying Liu, Minneapolis, Minn.; Robert A. Elek, Chardon, Ohio

[73] Assignee: Picker International, Inc., Highland Heights, Ohio

[21] Appl. No.: 08/976,857

[22] Filed: Nov. 24, 1997

[51] Int. Cl.[7] .................................................. A61B 5/055
[52] U.S. Cl. .......................... 600/422; 324/318; 324/322
[58] Field of Search .................................. 600/422, 410; 324/318, 322

[56] References Cited

U.S. PATENT DOCUMENTS

| | | | |
|---|---|---|---|
| 4,692,705 | 9/1987 | Hayes | 324/318 |
| 4,769,605 | 9/1988 | Fox et al. | 324/322 |
| 5,212,450 | 5/1993 | Murphy-Boesch et al. | |
| 5,277,183 | 1/1994 | Vij | 128/653.5 |
| 5,315,251 | 5/1994 | Derby et al. | 324/318 |
| 5,519,321 | 5/1996 | Hagen et al. | 600/422 |
| 5,602,479 | 2/1997 | Srinivasan et al. | 600/422 |
| 5,619,996 | 4/1997 | Beresten | 600/422 |
| 5,663,646 | 9/1997 | Kuth et al. | 600/422 |
| 5,664,568 | 9/1997 | Srinivasan et al. | 600/422 |

OTHER PUBLICATIONS

"Quadrature Detection in the Laboratory Frame." Hoult, et al., Magnetic Resonance in Medicine, v. 1, 339–353 (1984).

"A Quadrature Coil for the Adult Human Head." Sank, et al., Journal of Mafnetic Resonance, v. 69, 236–242 (1986).

"A Quadrature 5x5 Mesh Dome Resonator for Head Imaging and Spectroscopy." Meyer, et al., SMR 2nd Meeting, San Francisco, Book of Abstracts, 217 (1994).

"An Endcap Birdcage Resonator for Quadrature Head Imaging." Hayes, SMRM 5th Annual Meeting, Montreal, Book of Abstracts, Works in Progress, 39–40 (1986).

"A Volume Optimized Elliptical Endcap Brain Coil." Wong, et al., SMRM 11th Annual Meeting, Berlin, Book of Abstracts, 4015 (1992).

"A Mulltiple–Frequency Coil with a Highly Uniform $B_1$ Field." Bollinger, et al., Journal of Magnetic Resonance, v. 81, 162–166 (1988).

"Quadrature–Headcoil and Helmholtz–Type Neckcoil—an Optimized RF Antenna–Pair for Imaging Head, Neck and C–Spine at 1.0T and 1.5T." Krause, et al., SMRM 7th Annual Meeting, San Francisco, Book of Abstracts, 845 (1988).

"Evaluation of a 'True' Dome Quadrature Head Coil for Functional Imaging." Srinivasan, et al., SMR, 3rd Scientific Meeting, Nice, France, Book of Abstracts, 973 (1995).

"A $B_1$ Optimized, Hybrid–Quadrature Dome Resonator for Head Imaging." Srinivasan, et al, SMR, 3rd Scientific Meeting, Nice, France, Book of Abstracts, 972 (1995).

(List continued on next page.)

Primary Examiner—Ruth S. Smith
Attorney, Agent, or Firm—Fay, Sharpe, Fagan, Minnich & McKee, LLP

[57] ABSTRACT

A less-claustrophobic, quadrature, radio-frequency head coil (42) includes first and second broken end rings (90, 92) connected to each other in parallel by a plurality of leg conductors (94). At least two of the leg conductors are interconnected by a third arcuate conductor segment (98) axially displaced from planes of the first and second end rings to provide an opening (44) over a subject's face. The opening reduces patient claustrophobia and permits access to the patient for life-support devices or the practice of interventional medicine. The end rings have a fixed capacitance ($C_1$, $C_2$) between each pair of leg conductors. The fixed capacitance $C_1$ between at least one pair of leg conductors and the fixed capacitance $C_2$ between at least the pair of leg conductors adjacent the opening, where $C_2 > C_1$. A two-port feed (66, 68) circumferentially attached to the coil generally opposite the opening matches the individual linear modes. Thus, the radio frequency coil is able to maintain two preferred principal linear modes (A, B) across the open area of the coil.

17 Claims, 7 Drawing Sheets

OTHER PUBLICATIONS

"A Hybrid Birdcage Coil Design for Improved Sensitivity and Homogeneity in Head Imaging and Spectroscopy." Meyer, et al., SMRM 12th Annual Meeting, New York, Book of Abstracts, 217 (1994).

"A User–Friendly, 'Open–Faced' Head Coil for MRI at 1.5T." Srinivasan, et al., SMR 4th Scientific Meeting, New York, Book of Abstracts (1996).

LESS-CLAUSTROPHOBIC, QUADRATURE, RADIO-FREQUENCY HEAD COIL FOR NUCLEAR MAGNETIC RESONANCE

BACKGROUND OF THE INVENTION

The present invention relates to the magnetic resonance arts. It finds particular application in conjunction with a radio frequency magnetic resonance imaging coil which is tuned to the resonance frequencies of hydrogen (or other dipoles of interest) for anatomical, angiographic, functional and other medical imaging of humans and will be described with particular reference thereto. It is to be appreciated, however, that the invention will also find application in animal studies, other non-human studies, spectroscopy, phased-array coil techniques, and the like.

Conventionally, magnetic resonance imaging systems generate a strong, uniform static magnetic field in a free space or bore of a magnet. This main magnetic field polarizes the nuclear spin system of an object in the bore to be imaged. The polarized object then possesses a macroscopic magnetic moment vector pointing in the direction of the main magnetic field. In a superconducting main annular magnet assembly, the static magnetic field $B_0$ is generated along a longitudinal or z-axis of the cylindrical bore.

To generate a magnetic resonance signal, the polarized spin system is excited by applying a magnetic resonance signal or radio frequency field $B_1$, perpendicular to the z-axis. The frequency of the magnetic resonance signal is proportional to the gyromagnetic ratio $\gamma$ of the dipole(s) of interest. The radio frequency coil is commonly tuned to the magnetic resonance frequency of the selected dipole of interest, e.g., 64 MHZ for hydrogen dipoles $^1H$ in a 1.5 Tesla magnetic field.

Typically, a radio frequency coil for generating the magnetic resonance signal is mounted inside the bore surrounding the sample or patient. In a transmission mode, the radio frequency coil is pulsed to tip the magnetization of the polarized sample away from the z-axis. As the magnetization precesses around the z-axis back toward alignment, the precessing magnetic moment generates a magnetic resonance signal which is received by the radio frequency coil in a reception mode.

For imaging, a magnetic field gradient coil is pulsed for spatially encoding the magnetization of the sample. Typically, the gradient magnetic field pulses include gradient pulses pointing in the z-direction but changing in magnitude linearly in the x, y, and z-directions, generally denoted $G_x$, $G_y$, and $G_z$, respectively. The gradient magnetic fields are typically produced by a gradient coil which is located inside the bore of the magnet and outside of the radio frequency coil.

Conventionally, when imaging the torso, a whole body radio frequency coil is used in both transmit and receive modes. By distinction, when imaging the head, neck, shoulders, or an extremity, the whole body coil is often used in the transmission mode to generate the uniform excitation field $B_1$ and a local coil is used in the receive mode. Placing the local coil close to the imaged region improves the signal-to-noise ratio and the resolution. In some procedures, local coils are used for both transmission and reception. One drawback to local coils it that they tend to be relatively small.

One type of local frequency coil is known as the "birdcage" coil. See, for example, U.S. Pat. No. 4,692,705 of Hayes. Typically, a birdcage coil has a pair of circular end rings which are bridged by a plurality of equi-spaced straight segments or legs. In a primary mode, currents in the rings and legs are sinusoidally distributed which results in improved homogeneity along the axis of the coil. Homogeneity along the axis perpendicular to the coil axis can be improved to a certain extent by increasing the number of legs in the coil. Typically, a symmetric birdcage coil has eight-fold symmetry. Such a symmetric birdcage coil with N legs exhibits N/2 mode pairs. The first (N/2)–1 mode pairs are degenerate, while the last mode pair is non-degenerate. The primary mode of such an eight-fold symmetric birdcage coil has two linear modes which are orthogonal to each other. The signals from these two orthogonal or quadrature modes, when combined, increase signal-to-noise ratio on the order of 40%. The simplest driven current pattern or standing waves are defined by superpositions of degenerate eigenfunctions. For a low-pass birdcage of n meshes driven at its lowest non-zero eigenfrequency, the current in the n-th mesh is given by $\sin(2\pi n/N+\phi)$. The phase angle $\phi$ determines the polarization plane of the resulting $B_1$ radio frequency field and can be varied continuously by suitable application of driving voltages. The alignment and isolation of the two linear modes of a birdcage coil are susceptible to sample geometry. That is, the sample dominates the mode alignment and isolation between the two linear modes.

A typical 16-legged, high-pass birdcage coil has a diameter and length of about 30 centimeters. Capacitors interrupt the end rings between adjacent legs for a total of 32 such capacitors which are evenly distributed through the two end rings. Such a coil exhibits 7 degenerate modes and one non-degenerate mode. The principal or k=1 mode is tuned to approximately 63.72 MHZ which is the magnetic resonance frequency of protons in a 1.5 T static magnetic field. The birdcage coil uses a four-port electric current feed.

Generally, when used with annular superconducting magnets, the local RF head coil is oriented such that the coil axis is parallel to the magnetic axis. This enables the patient to access the coil volume easily. Further, this orientation takes advantage of the quadrature aspect of the local head coil with respect to the orientation of the main magnetic $B_0$ field. With this arrangement, the legs are parallel to the horizontal magnetic axis.

One problem with local RF head coils is their claustrophobic effect on patients. Many pediatric and adult patients already experience claustrophobic reactions when placed inside the horizontal bore of a superconducting magnet. Placement of a close-fitting head coil having anterior legs which obstruct the direct view of the patients further adds to their discomfort. The discomfort is somewhat reduced by illumination inside the magnet bore, air flow and the use of reflective mirrors. However, these remedies are not enough to eliminate the claustrophobia problems.

Another problem with conventional head coils is that the design limits access to the patient. For example, it is often desirable to perform interventional medicine or use life-support devices, such as ventilator tubes, while imaging a patient. However, the proximity of the axial segments to one another and to the head of the patient impair such practices.

The present invention contemplates a new and improved radio frequency coil design which overcomes the above-referenced problems and others.

SUMMARY OF THE INVENTION

In accordance one aspect of the present invention, a magnetic resonance apparatus includes a magnet for generating a temporally constant, uniform magnetic field through an examination region. Further, the apparatus includes a volume radio frequency coil which performs at least one of (1) transmitting radio frequency signals into the examination region to induce and manipulate magnetic resonance of dipoles disposed in the examination region, and (2) receiving radio frequency signals from the dipoles disposed in the examination region. Still further, the apparatus includes a processor for processing the received magnetic resonance signals. The volume radio frequency coil comprises first and second broken end ring conductor segments disposed in parallel planes and connected to each other by a plurality of leg conductors. Further, the coil includes a first arcuate conductor segment connected with a pair of displaced, adjacent leg conductors. The first arcuate conductor segment is axially displaced from the planes of the first and second broken end ring conductor segments providing an open area in a perimeter of the coil. Further, the coil includes capacitances of first capacitance $C_1$ and second capacitance $C_2$ being disposed between each pair of leg conductors in the first and second broken end ring conductor segments, where $C_1 \neq C_2$. Thus, the radio frequency coil maintains two preferred principal linear modes across the open area of the coil.

In accordance with a more limited aspect of the present invention, the first and second broken end ring conductor segments have the capacitance $C_2$ between adjacent pairs of leg conductors immediately on either circumferential side of the first arcuate conductor segment.

In accordance with another more limited aspect of the present invention, the first arcuate conductor segment has a capacitance $C_3$, where $C_3 \neq C_1 \neq C_2$, such that the two principal linear modes of the volume coil are aligned and isolated.

In accordance with a still more limited aspect of the present invention, $C_2 > C_1 > C_3$ such that the two principal linear modes of the volume coil are aligned and isolated.

In accordance with another aspect of the present invention, a magnetic resonance method comprises electrically connecting evenly spaced leg conductors between two discontinuous end rings disposed in a parallel spaced-apart relation. A first and last of the leg connectors define an opening therebetween, which opening subtends an angle of greater than 30 degrees. The opening is bridged with at least two arcuate segments evenly displaced from the discontinuous end rings. The discontinuous end rings are interrupted between each pair of leg conductors with capacitances. The capacitances are larger adjacent the opening. Each arcuate segment is interrupted with a capacitance that is lower than any of the capacitances in the discontinuous end ring. The capacitance is adjusted to provide two principal orthogonal modes tuned to a desired resonant frequency. A static magnetic field is generated inside the coil. Magnetic resonance of selected dipoles is induced at the desired resonant frequency. Magnetic resonance signals are received with the coil. The magnetic resonance signals from the volume coil are reconstructed into an image representation.

One advantage of the present invention is that the coil has a signal-to-noise ratio and homogeneity that is comparable to a conventional coil of similar dimension.

Another advantage of the present invention resides in improved patient comfort.

Another advantage is that coil permits use of life support, diagnostic and other systems during magnetic resonance imaging of the patient. Similarly, the coil permits interventional surgery while the coil is in place on the patient.

A further advantage of the invention is that it permits easy adaptation of other RF coils into less-claustrophobic coils.

Another advantage of the present invention resides in additional degrees of freedom in coil design for optimizing the $B_1$ field profile, and the like.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
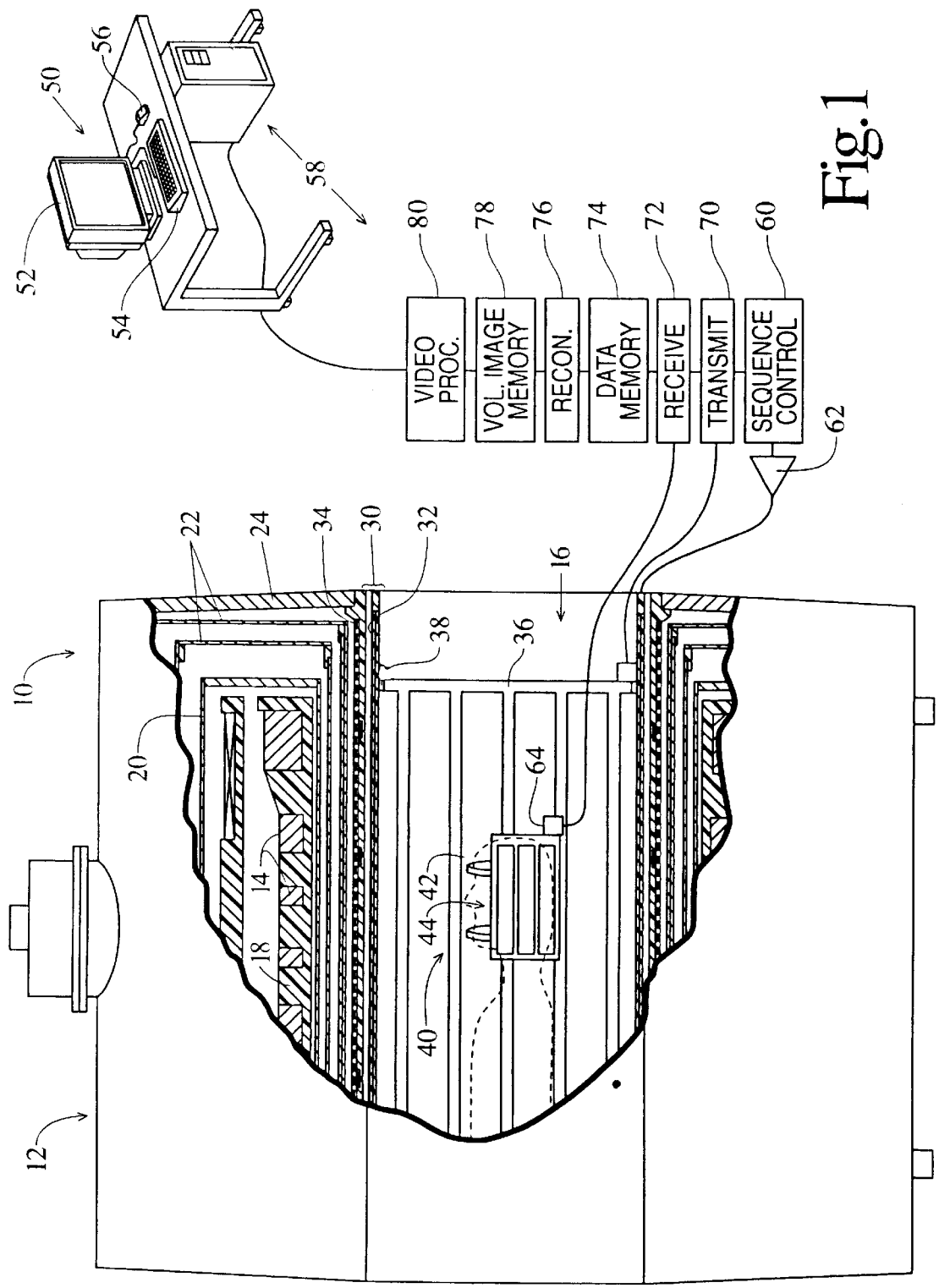
FIG. 1 is a diagrammatic illustration of a magnetic resonance imaging system in accordance with the present invention.

With reference to FIG. 1, a magnetic resonance imaging system 10 includes a cryogenic magnet assembly 12 which has a plurality of primary superconducting magnetic coils 14. A uniform, temporally constant magnetic field $B_0$ is generated along a longitudinal or z-axis of a central bore 16. In a preferred superconducting embodiment, the primary magnetic coils are supported by a former 18 and received in a toroidal helium vessel or can 20. The vessel is filled with helium to maintain the primary magnet coils at superconducting temperatures. The can is surrounded by a series of cold shields 22 which are supported in a vacuum dewar 24. Of course, annular resistive magnets, C-magnets, and the like are also contemplated.

A whole body gradient coil assembly 30 includes x, y, and z-coils mounted along the bore 16 for generating gradient magnetic fields, $G_x$, $G_y$ and $G_z$. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum dewar 24. A whole body radio frequency coil 36 is mounted inside the gradient coil assembly 30. A whole body radio frequency shield 38, e.g., copper mesh, is mounted between the whole body RF coil 36 and the gradient coil assembly 30.

Figure 2:
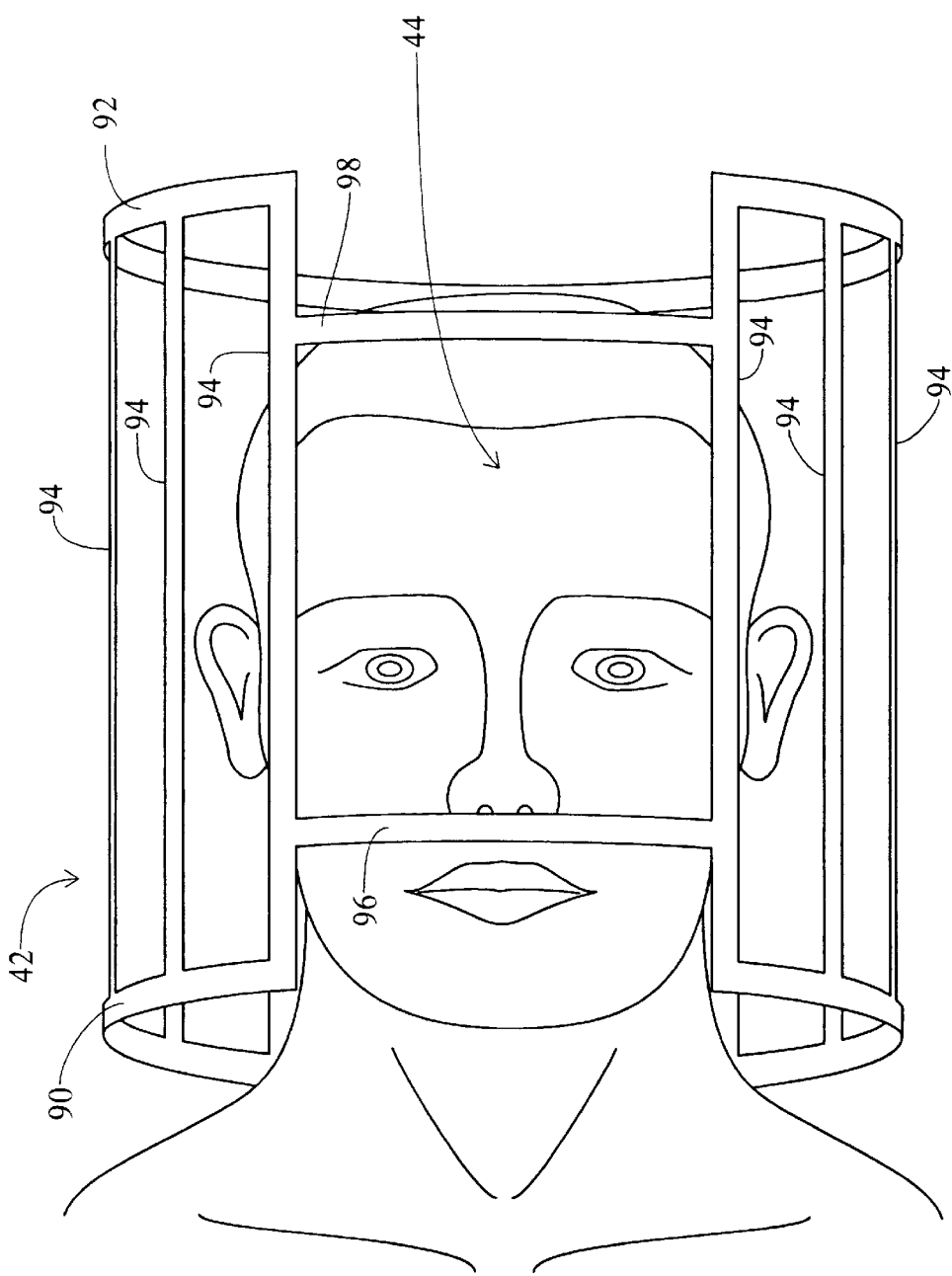
FIG. 2 is a top perspective view of the preferred coil of FIG. 1.

With continuing reference to FIG. 1 and further reference to FIG. 2, a local radio frequency coil assembly 40 is removably mounted in the bore of the examination region defined around the isocenter of the magnet 12. In the preferred embodiment of FIG. 2, the local radio frequency coil assembly 40 includes a less-claustrophobic style quadrature coil 42 with an opening 44 over a subject's face.

With continuing reference to FIG. 1, an operator interface and control station 50 includes a human-readable display, such as a video monitor 52, and an operator input means including a keyboard 54, a mouse 56, a trackball, light pen, or the like. A computer control and reconstruction module 58 includes hardware and software for enabling the operator to select among a plurality of preprogrammed magnetic resonance sequences that are stored in a sequence control memory. A sequence controller 60 controls gradient amplifiers 62 and a digital transmitter 70. The gradient amplifiers are connected with the gradient coil assembly 30 for causing the generation of the $G_x$, $G_y$, and $G_z$ gradient magnetic fields at appropriate times during the selected gradient sequence. The digital transmitter 70 causes a the whole body frequency coil 36 to generate $B_1$ radio frequency field pulses at times appropriate to the selected sequence.

The resonance frequency signals are demodulated by a digital receiver 72 and stored in a data memory 74. Data from the memory is reconstructed by a reconstruction or array processor 76 into corresponding volumetric image representations that are stored in corresponding portions of an image memory 78. A video processor 80, under operator control, converts selected portions of the volumetric image representation into slice images, projection images, perspective views, or the like as is conventional in the art for display on the video monitor 52.

Figure 3:
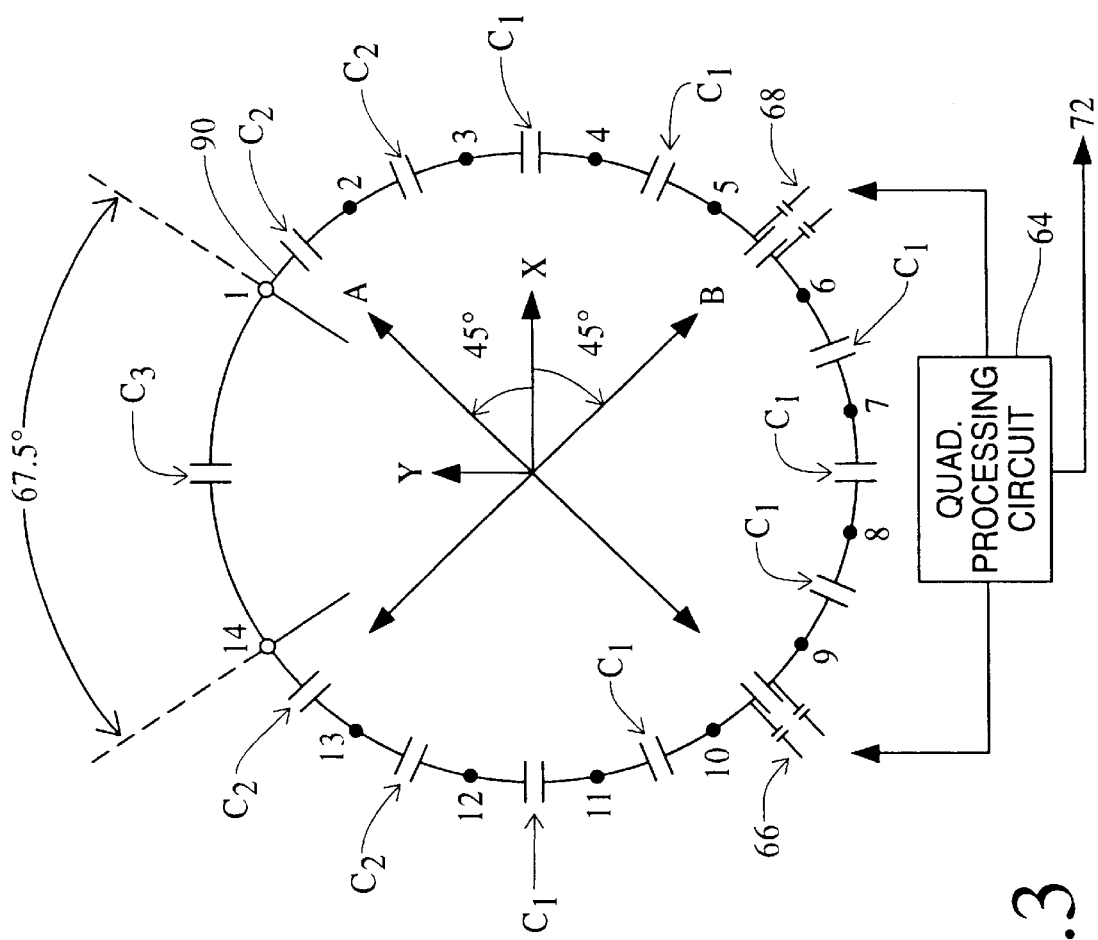
FIG. 3 is a sectional, axial view of the preferred coil of FIG. 2 showing the location of the 14 conductor segments and the two-port feed.

With continuing reference to FIG. 1 and further reference to FIG. 3, because the coil 42 is quadrature, it has outputs for two linear modes, preferably orthogonal modes A and B. In the preferred embodiment, the orthogonal modes of the coil are processed by a quadrature, hybrid, coil-mounted processing circuit 64 which preamplifies, combines, and digitizes the received radio frequency magnetic resonance signals. Alternately, the analog resonance signals can be phase shifted by 90° and combined in analog and their sums digitized for conveyance to the receiver. As yet another embodiment, the analog sum can be conveyed directly to the receiver, which receiver demodulates and digitizes the resultant resonance signals. The processing circuit 64 provides a two-port feed to 90° offset points 66 and 68 along the circumference of the coil. A current flowing through the n-th leg varies as $\sin(2\pi n/N+\phi)$, where $\phi$ is the phase angle which determines the polarization plane of the resulting $B_1$ radio frequency field. The illustrated less-claustrophobic coil construction exhibits a standing wave behavior. Due to the sinusoidal current distributions, its two modes A, B are orthogonal to one another and offer homogeneous $B_1$ field distributions for uniform transmission and reception. The circuit provides asymmetric current distribution with respect to the two feed points, and provides a high degree of $B_1$ homogeneity in the x, y, and z planes at coil center. This uniformity at coil center is achieved without compromising the signal to noise ratio at coil center.

With reference again to FIGS. 2 and 3, the less-claustrophobic insert coil 40 of the preferred embodiment is designed to be converted from a conventional sixteen-leg high-pass birdcage coil without compromising signal to noise and RF homogeneity. The conventional coil has eight-fold symmetry while the resultant, less-claustrophobic coil has four-fold symmetry. The conventional coil has 74 pF capacitors distributed evenly in each mesh of the coil. With this arrangement of the conventional coil, the principal or k=1 mode has been tuned very close to 63.72 MHZ which is the nuclear magnetic resonance frequency for protons at 1.5 T.

The less-claustrophobic insert coil includes a pair of broken end rings or first and second arcuate conductor segments 90 and 92, respectively, subtending approximately 292.5° of arc. In another embodiment, the less-claustrophobic coil may have an endcap in place of one of the discontinuous end rings.

The pair of broken end rings 90, 92 are connected in parallel by N leg conductors or legs 94. Here, two anterior legs have been removed to open the viewing area of the patient. Thus, in the present preferred embodiment, N=14. Third and fourth arcuate conductor segments 96 and 98, respectively, which subtend 67.5° of arc, connect the circumferentially first and the fourteenth legs, i.e., leg N =1 and leg N=14. The segments 96 and 98 are positioned toward the coil center from the broken end rings 90, 92 such that they are equally-spaced from the remaining sections of the broken end rings With continuing reference to FIG. 3 and further reference to FIG. 4, each of the pair of broken end rings 90, 92 is interrupted with capacitors $C_1$ and $C_2$. Similarly, the arc segments 96, 98 are interrupted with capacitors $C_3$ and $C_3'$, respectively, and a tuning capacitor $C_4$. The tuning capacitor $C_4$ is placed across the fixed value capacitor $C_3$ in the anterior opening to align and isolate the two principal modes of the coil. Note that the circuit diagram of FIG. 4 has been broken and laid flat and that the circuit continues to the right with capacitors $C_1$. The capacitors are sized and tuned such that the coil operates at a selected nuclear magnetic resonance frequency. Alternately, the geometry of the coil can be adjusted to adjust the resonant frequencies. For example, physical dimensions, number of legs, impedance properties of the coil, and the like can be changed.

Figure 4:
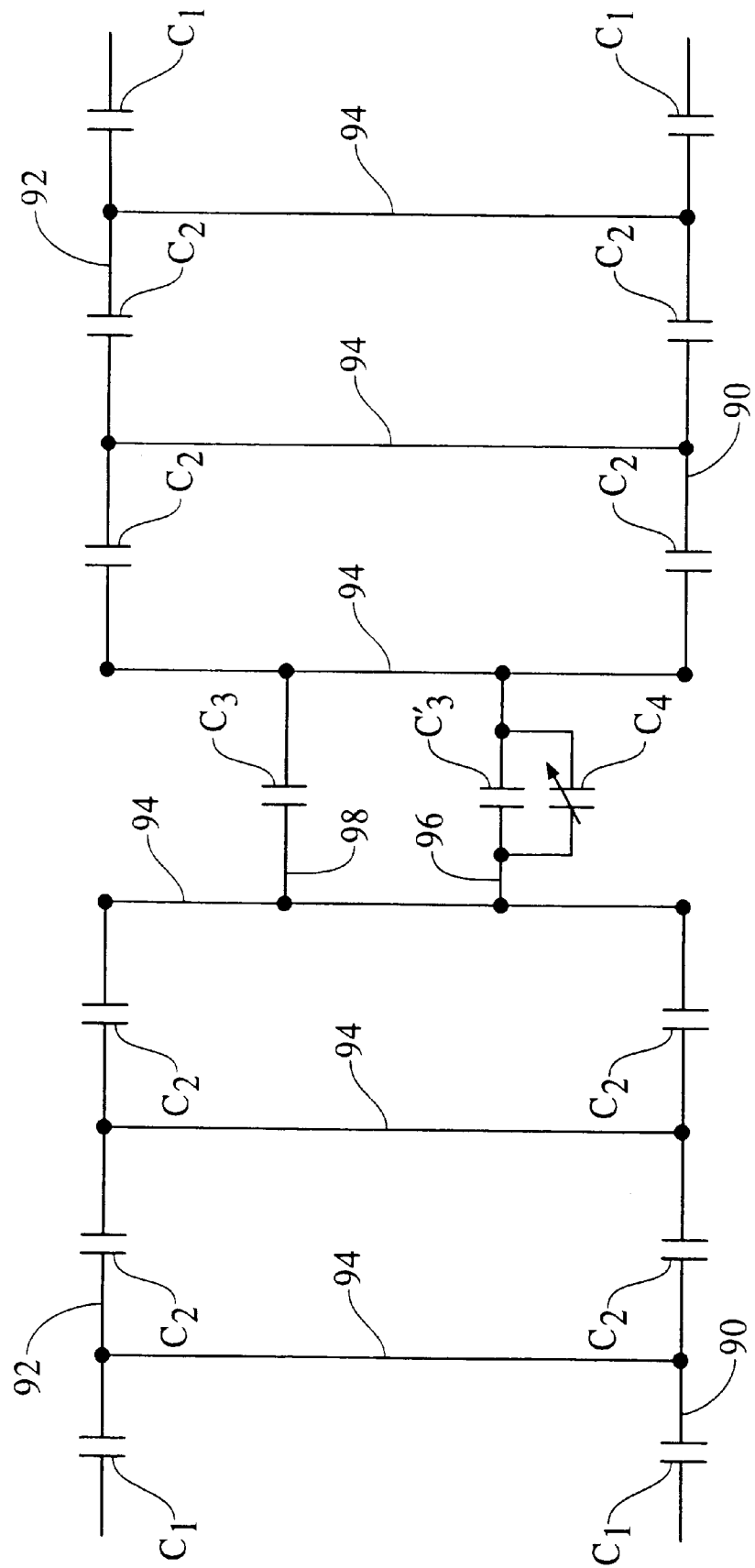
FIG. 4 is a partial circuit diagram for the preferred coil of FIG. 2.

With continuing reference to FIGS. 2, 3, and 4, the distribution of the legs, the inductance and capacitance values in the different conductors or meshes, and the sinusoidal current distribution are adjusted to maintain similar phase shifts with a comparable birdcage coil without losing the circular polarization and quadrature aspect of the resonator. In the embodiment shown, the coil has a diameter and length of 30 cm. The two arc end ring segments 96, 98 are spaced 15 cm apart. The principal or k=1 mode is tuned to approximately 63.72 MHZ which is the magnetic resonance frequency of protons in a 1.5 T static magnetic field. The coil is built with copper foil that is 1.25 cm wide and 0.05 mm thick. Interrupting the two broken end ring segments near the opening are high capacitances $C_2$. Further, interrupting the two broken end ring segments away from the opening are low capacitances $C_1$. Still further, interrupting one of the arc segments is lower capacitance $C_3$. With this fixed geometry and a fixed self-inductance, the capacitance values are optimized to maintain the sinusoidal current distribution for the principal mode resonating at 63.72 MHZ. In the preferred embodiment, $C_1$=74 pF, $C_2$=81 pF, and $C_3$=30 pF. It is to be appreciated by those skilled in the art that given other geometries and inductances, other optimal capacitances are necessarily selected to appropriately tune the coil.

In another embodiment, additional capacitors are placed at 45 degrees with respect to the coupling ports on the coil to tune and isolate the two principal linear modes. Alternately, isolation can be achieved by a remote isolation network or combination of the additional capacitors and network. Further, higher order modes can be used for imaging. Still further, the principal modes can be tuned to the same or different frequencies. In addition, the less-claustrophobic coil can be used alone for transmit, receive, or transmit and receive purposes. Alternately, the coil can be used with local gradients for very high-resolution or rapid imaging.

In comparison to a similar sixteen leg birdcage coil having four-port feed, the less-claustrophobic coil 40 has improved the signal to noise ratio at coil center by approximately 4%. Also, the uniformity in the axial slice in the central axial plane is 89% as compared to 93% for the similar birdcage coil. This difference in uniformity is due to use of a four port feed in the birdcage coil rather than the two port feed of the less-claustrophobic coil. Weighted spin echo images using identical imaging parameters display little or no difference in the overall image quality.

Figure 5A:
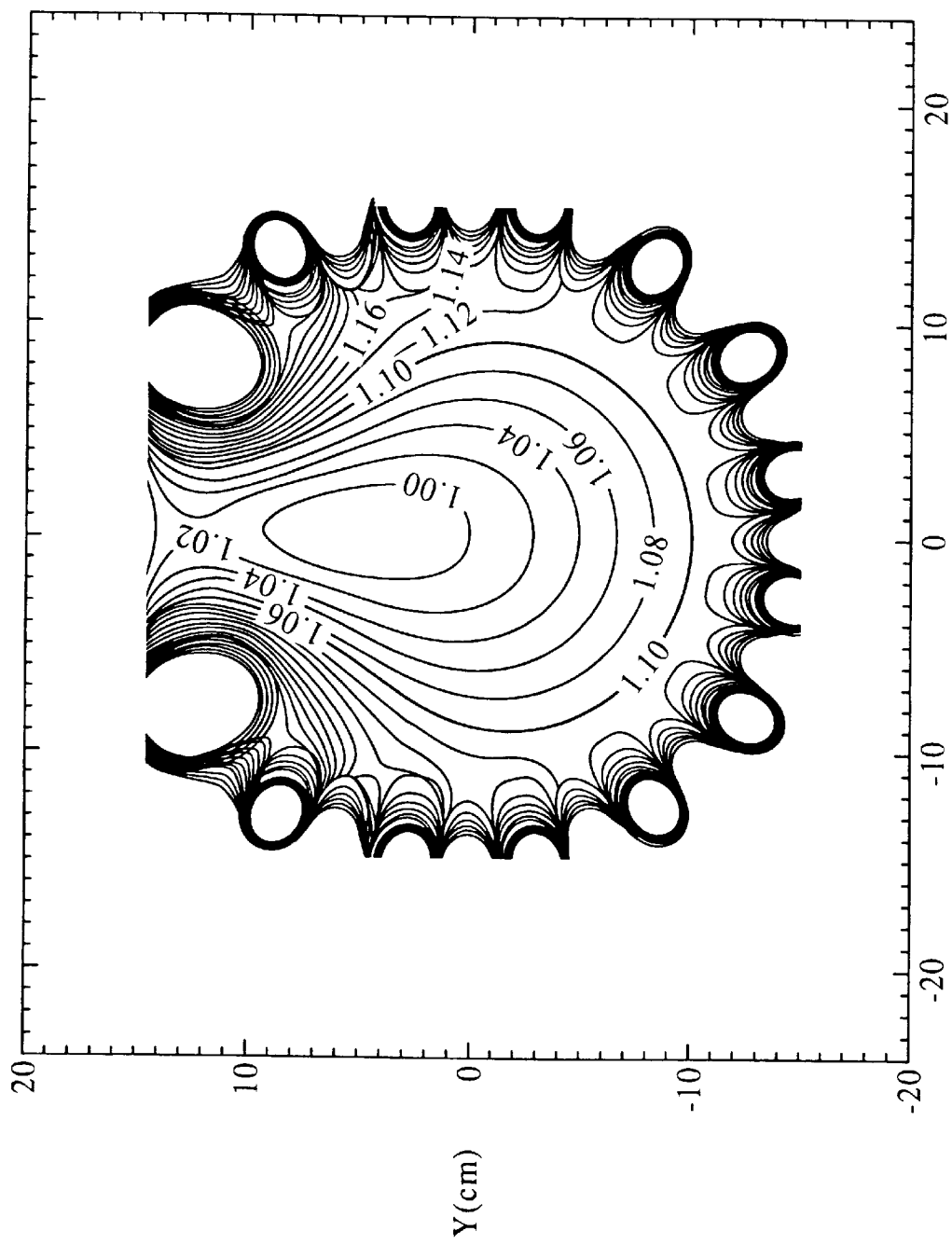
FIG. 5A illustrates the contours of the $B_1$ field in an axial plane in the preferred coil of FIG. 2.
Figure 5B:
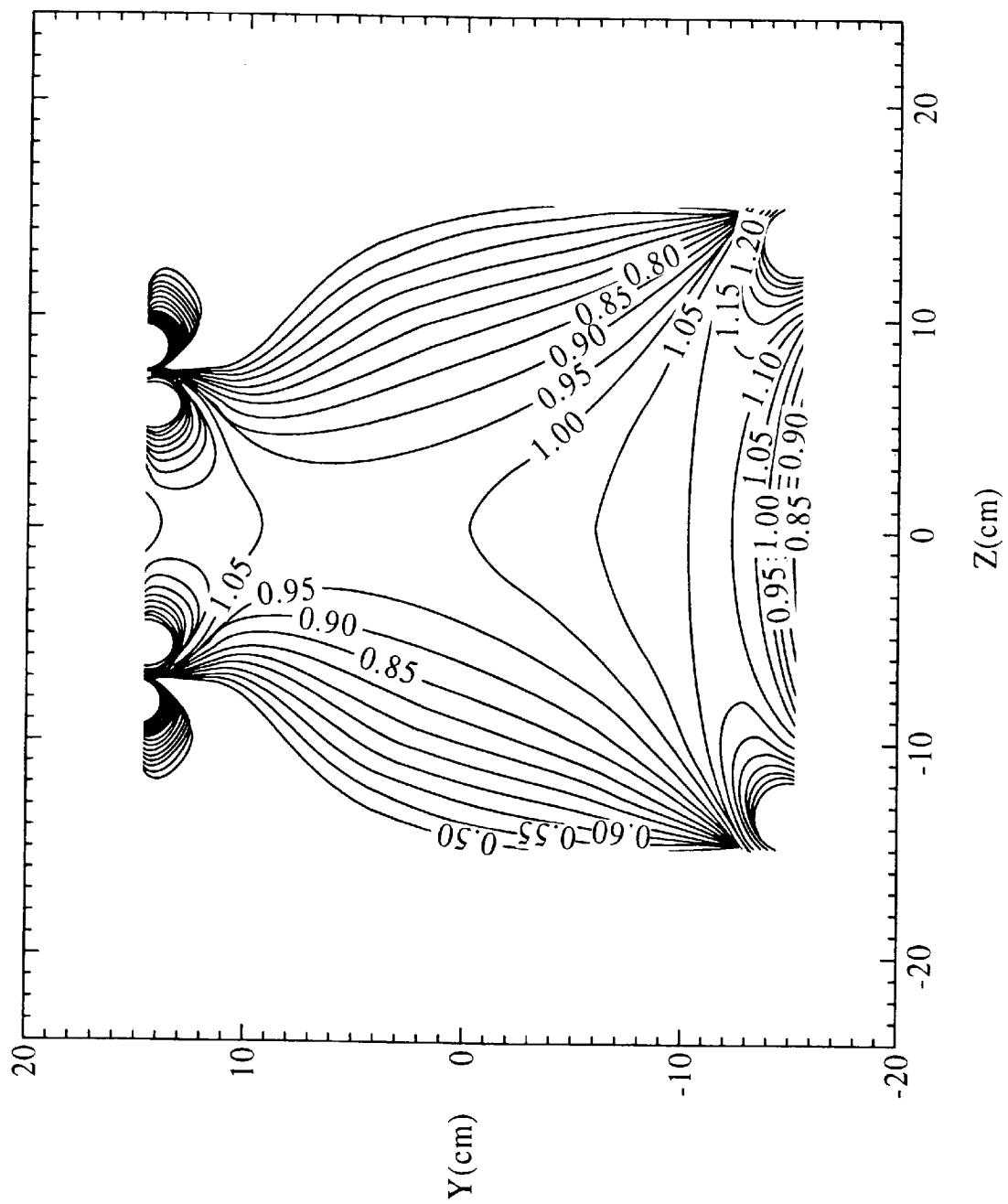
FIG. 5B illustrates the contours of the $B_1$ field in a sagittal plane in the preferred coil of FIG. 2.

With reference to FIG. 5A and FIG. 5B, the less-claustrophobic coil provides satisfactory uniformity of the B1 field in the axial and sagittal planes of the coil, respectively. The anterior region of the axial slice has exceptional uniformity which may be advantageously used in imaging this area. The signal intensities computed using Biot Savart calculations for unity current at the coil centers for the conventional birdcage coil and the less-claustrophobic coil of FIG. 2 are 0.06184 and 0.05825 units, respectively. Thus, there is little reduction (approximately 6%) in the signal intensities at coil center. In alternate embodiments, the signal intensity is further optimized with careful placements of the legs and end ring segments.

Figure 6:
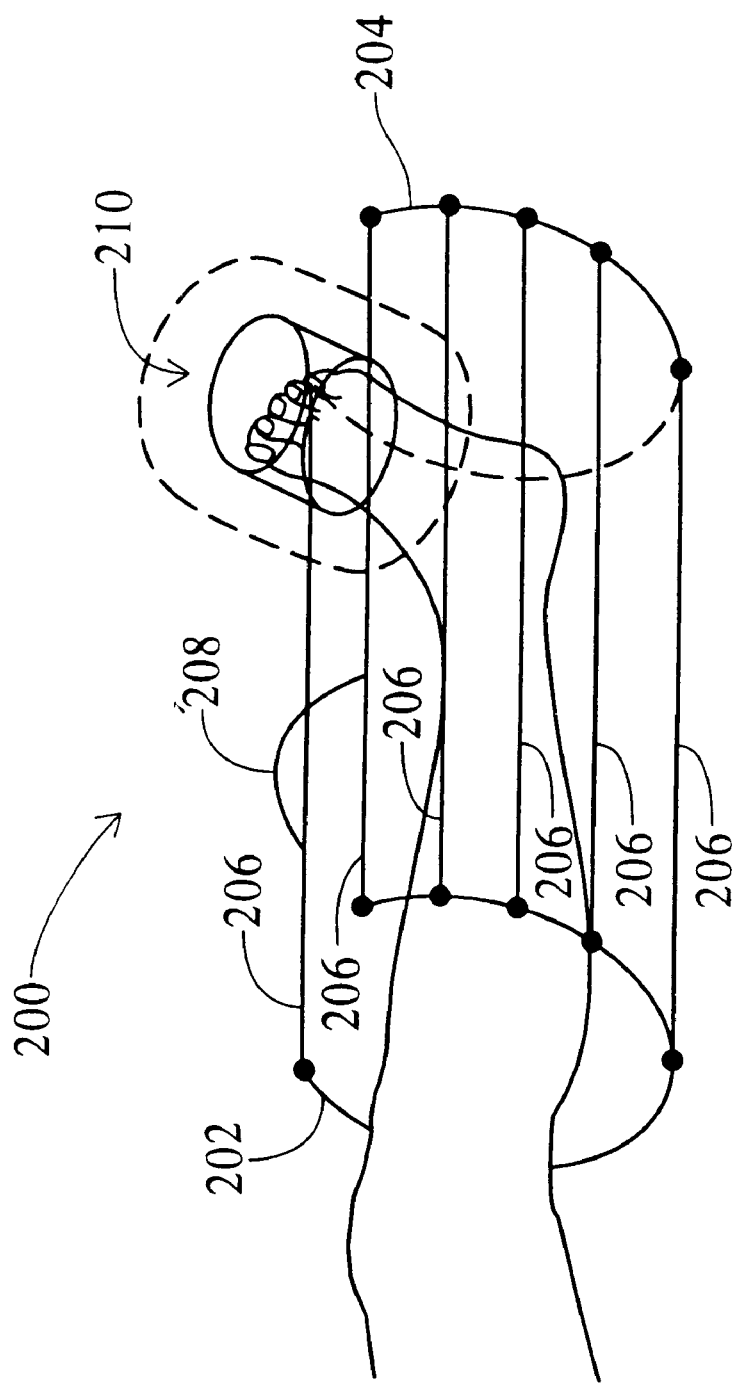
FIG. 6 illustrates an alternate embodiment of the present invention for imaging the ankle and foot.

With reference to FIG. 6, an alternate embodiment includes an elongated RF coil 200 for use in imaging extremities such as the knee and foot. The coil includes a pair of broken end rings 202, 204 connected in parallel by legs 206. An arcuate cross-segment 208 and toe coil 210 connect two widely-spaced legs of the elongated RF coil. The toe coil is at an angle of approximately 10 to 20 degrees with respect to the vertical axis to accommodate most feet in a relaxed position. The toe coil, preferably, has inner volume to receive the toes of a patient. Another embodiment for knee and foot imaging includes a split top design of the elongated RF coil which provides easier patient access and positioning.

Various alternate embodiments are, of course, immediately apparent. For example, another less-claustrophobic coil has an elliptical shape, an elliptical shape with an end cap, or other geometry to accommodate the anatomy under investigation. Alternate coil embodiments have shoulder cutouts to image the head and neck while still maintaining four-fold, two-fold or no-fold symmetry. Further, alternate coil embodiments include coils overlapped with another volume or surface coil, i.e., saddle, solenoid, birdcage, dome, etc., for minimal mutual inductance. Careful placement of the legs and the end ring segments, and carefully selecting and distributing capacitance values significantly aids altering the $B_1$ field distribution without affecting the overall signal to noise ratio. Further, the impedance and the corresponding currents are altered to maintain the same voltage drop across elements in the coil. Alternately, the voltage and the impedance are altered to provide the same current distribution along the coil. However, when the voltage and the current are altered in sections of the coil, the other impedances in the coil are altered to bring the voltage or the current distributions back to their original state. This change in impedance is accomplished, for example, by changing the inductance or the capacitance values or both. In each of these embodiments, the principal mode is tuned to the magnetic resonance frequency of the desired dipoles for optimal performance. As a result, compared to their claustrophobic counterparts, less-claustrophobic coils provide optimal image signal to noise and $B_1$ uniformity while enhancing patient comfort.

In another embodiment, the less-claustrophobic coils are scaled down to image pediatric and premature neonates or other small subjects. Preferably, the coil is connected with a patient support system, such as a gantry. Once the patient is positioned, the coil then slides forward to a preset position on the patient support system. This insures proper and quick positioning before starting a magnetic resonance study.

It is obvious that the less-claustrophobic coils of the present invention allow use of life support devices, such as ventilation tubes while the patient is inside the magnet bore during a magnetic resonance study. Further, the less-claustrophobic coils or obvious modifications thereof allow use of photic simulation devices, such as strobe lights place directly over the eyes, for brain functional MR imaging experiments. Still further, the less-claustrophobic coils of the present invention allow placement of displays inside the magnet bore for educational or recreational viewing by the patient.

In alternate embodiments of the invention, the techniques expressed here for modifying magnetic resonance RF coils, i.e., modifying shape, number of legs, positioning of segments, etc., are applicable to other distributed type coils such as volume and surface coil designs. For example, saddle coils, solenoid coils, dome-type volume coils and the like can be physically altered so long as appropriate capacitance and inductance values are selected to compensate for phases shifts. Thus, near optimal performance characteristics are achieved without compromising patient comfort or accessibility.

In still further alternate embodiments, either two or a symmetric four-port magnetic (inductive) or electrical (capacitive) coupling are used to match the two linear modes of the coil to 50 ohms. In addition, the currents in the opening and remainder of the coil may be optimally controlled by careful placement of conductor elements and varying the mesh impedances in and around the opening. Further, the coils can be of a high-pass, low-pass, or band-stop configuration, or any combination thereof.

As yet another alternate embodiment, the less-claustrophobic coil is used in combination with an additional radio-frequency coil. The less-claustrophobic coil is tuned to more than one resonance frequency as is the additional coil. Analogously, the less-claustrophobic coil and additional coil are tuned to different resonance frequencies.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus which includes a magnet for generating a temporally constant, uniform magnetic field through an examination region, a volume radio frequency coil which performs at least one of (1) transmitting radio frequency signals into the examination region to induce and manipulate magnetic resonance of dipoles disposed in the examination region, and (2) receiving radio frequency signals from the dipoles disposed in the examination region, and a processor for processing the received magnetic resonance signals, the volume radio frequency coil comprising:

first and second incomplete end ring conductor segments disposed in parallel planes;

a plurality of equispaced leg conductors connected between the first and second incomplete end rings;

first and second arcuate conductor segments connected with a pair of displaced, adjacent leg conductors on opposite ends of the incomplete end ring conductor segments, the first and second arcuate conductor segments being axially displaced from the planes of the first and second incomplete end ring conductor segments, providing an open area in a perimeter of the coil, the first and second arcuate conductor segments having a length greater than the equidistant spacing between the leg conductors, at least one of the arcuate segments having a capacitance $C_3$;

a first capacitance $C_1$ and a second capacitance $C_2$ disposed between each pair of leg conductors in the first and second incomplete end ring conductor segments, where $C_1 \neq C_2 \neq C_3$, such that the radio frequency coil maintains two isolated principal linear modes across the open area of the coil.

2. The magnetic resonance apparatus of claim 1, wherein:

the first and second incomplete end ring conductor segments having the capacitance $C_2$ between the pair of leg conductors connected with the first and second arcuate conductor segments.

3. The magnetic resonance system of claim 2, wherein:

the first arcuate conductor segment has a capacitance $C_3$, where $C_3 \neq C_1 \neq C_2$, such that the two principal linear modes of the volume coil are aligned and isolated.

4. The magnetic resonance apparatus of claim 3, wherein: $C_2 > C_1 > C_3$ such that the two principal linear modes of the volume coil are aligned and isolated.

5. The magnetic resonance apparatus of claim 4, wherein:

the second arcuate conductor segment has an adjustable capacitance for aligning and isolating the two principal linear modes of the volume coil.

6. The magnetic resonance apparatus of claim 5, wherein:

the first and second arcuate conductor segments are axially displaced from one another by a distance of approximately one half an axial length of the leg conductor segments.

7. The magnetic resonance apparatus of claim 4, further including:

at least one additional radio frequency coil disposed in conjunction with the volume radio frequency coil.

8. A magnetic resonance apparatus which includes a magnet for generating a temporally constant, uniform magnetic field through an examination region, a volume radio frequency coil which performs at least one of (1) transmitting radio frequency signals into the examination region to induce and manipulate magnetic resonance of dipoles disposed in the examination region, and (2) receiving radio frequency signals from the dipoles disposed in the examination region, and a processor for processing the received magnetic resonance signals, the volume radio frequency coil comprising:

first and second incomplete end ring conductor segments disposed in parallel planes and connected to each other by a plurality of leg conductors;

a first arcuate conductor segment connected with a pair of displaced, adjacent leg conductors, the first arcuate conductor segment axially displaced from the planes of the first and second incomplete end ring conductor segments, providing an open area in a perimeter of the coil;

capacitances of a first capacitance $C_1$ and a second capacitance $C_2$ disposed between each pair of leg conductors in the first and second incomplete end ring conductor segments, where $C_1 \neq C_2$, such that the radio frequency coil maintains two preferred principal linear modes across the open area of the coil;

a fixed capacitance $C_3$ connected in the first arcuate conductor segment where $C_3 \neq C_1 \neq C_2$ to align and isolate the two principal linear modes of the volume coil; and an additional volume conductor coil connecting the pair of displaced adjacent leg conductors connected by the first arcuate conductor segment, the additional volume conductor coil providing an opening to accommodate a portion of a subject in the examination region.

9. The magnetic resonance system as set forth in claim 1, further including:

a two-port electric feed circumferentially attached to one of the incomplete end rings generally opposite the first and second arcuate conductor segments.

10. The magnetic resonance apparatus of claim 3, wherein:

the temporally constant, uniform magnetic field has a strength of approximately 1.5 T;

the capacitance $C_1$ has a value of approximately 74 pF;

the capacitance $C_2$ has a value of approximately 81 pF; and, the capacitance $C_3$ has a value of approximately 30 pF to tune the coil to approximately 63.72 MHZ.

11. A magnetic resonance system comprising:

a main magnet assembly which generates a uniform, temporally constant magnetic field through an examination region;

a radio frequency head coil positionable around a head of a subject in the examination region for at least receiving radio frequency signals from resonating dipoles of the subject, the radio frequency coil having first and second conductive incomplete end rings disposed in parallel spaced-apart relation along a common longitudinal axis, the first and second incomplete end rings defining a gap between ends thereof, the first and second conductive incomplete end rings being connected by a plurality of leg conductors arranged in a circumferential array, a first and a last of the plurality of leg conductors defining edges of a face opening, the first and the last leg conductors connected by arcuate conductor segments, the arcuate conductor segments being axially displaced from the planes of the first and second conductive incomplete end rings, the first and second incomplete end rings having a capacitance $C_1$ between at least one of the pairs of leg conductors and having capacitance $C_2$ between pairs of leg conductors adjacent either circumferential side of the face opening, the arcuate segments having a capacitance $C_3$, where $C_2 > C_2 > C_3$, and $C_1$, $C_2$, and $C_3$ are selected such that the radio frequency coil has first and second linear modes tuned to a resonant frequency of the resonating dipoles, the two linear modes being aligned along first and second orthogonal axes; and, a processor for processing magnetic resonance signals from the radio frequency coil into diagnostic information.

12. The magnetic resonance system as set forth in claim 11, further including:

a preamplifier mounted to the radio frequency coil for amplifying signals from the radio frequency coil.

13. The magnetic resonance apparatus of claim 12, wherein:

the arcuate segments are axially displaced from one another by a distance of approximately one half an axial length of the leg conductors.

14. The magnetic resonance system as set forth in claim 13, further including:

a two-port electric feed circumferentially attached to the radio frequency coil to match the individual linear modes of the radio frequency coil.

15. The magnetic resonance system as set forth in claim 14, further including:
- a gradient coil assembly disposed around the examination region for selectively generating magnetic field gradients along mutually orthogonal axes; and,
- wherein the processor includes a reconstruction processor for reconstructing the magnetic resonance signals into an image representation.

16. A magnetic resonance method comprising:
- electrically connecting a plurality of evenly spaced leg conductors between two discontinuous end rings disposed in a parallel spaced-apart relation, first and last of the leg conductors defining an opening therebetween, which opening subtends an angle of greater than a common angle defined between adjacent leg conductors;
- bridging the opening with at least two arcuate segments evenly displaced from the discontinuous end rings;
- interrupting the discontinuous end rings between each pair of leg conductors with capacitances, the capacitances being larger adjacent the opening;
- interrupting each arcuate segment with a capacitance that is lower than any of the capacitances in the discontinuous end rings;
- adjusting the capacitance to provide two isolated principal orthogonal modes tuned to a desired resonant frequency;
- generating a static magnetic field inside the leg conductors;
- inducing magnetic resonance of selected dipoles at the desired resonant frequency;
- receiving magnetic resonance signals with the leg conductors; and,
- reconstructing the received magnetic resonance signals into an image representation.

17. A radio frequency coil for a magnetic resonance imaging apparatus, the radio frequency coil comprising:
- a pair of incomplete end rings which each extend along parallel major arc segments between first and second ends;
- a pair of parallel leg segments connected between corresponding ends of the incomplete end rings of the incomplete end rings such that a gap is defined between the ends of the incomplete end rings and between the pair of parallel leg segments;
- a plurality of additional leg segments connected between the end rings;
- at least two conductive current paths connected between the pair of parallel leg segments spanning the gap, the conductive current segments being displaced from the end rings;
- capacitances in the end rings, capacitances adjacent the pair of leg segments adjacent the gap being larger than capacitances disposed away from the gap;
- further capacitance in the at least two conductive current paths spanning the gap which further capacitance is selected to support a quadrature rotating field mode of operation.

* * * * *